United States Patent

Beneking

[15] 3,659,156

[45] Apr. 25, 1972

[54] SEMICONDUCTOR DEVICE

[72] Inventor: Heinz Beneking, Aachen, Germany

[73] Assignee: Licentia, Patent-Verwaltungs-G.m.b.H., Frankfurt am Main, Germany

[22] Filed: May 1, 1970

[21] Appl. No.: 33,582

[30] Foreign Application Priority Data

May 31, 1969 Germany ......................P 19 27 876.3

[52] U.S. Cl. ............................317/234 R, 29/589, 148/175, 317/234 M, 317/234 N, 317/234 UA, 317/235 AD, 317/235 AK

[51] Int. Cl. ........................H01l 5/00, H01l 5/02, H01l 5/06

[58] Field of Search......317/235 AD, 234 M, 234 N, 234 UA

[56] References Cited

UNITED STATES PATENTS

| | | | |
|---|---|---|---|
| 3,373,323 | 3/1968 | Wolfrum et al. | 317/235 |
| 3,512,051 | 5/1970 | Noll | 317/234 |
| 2,981,877 | 4/1961 | Noyce | 317/235 |
| 3,271,201 | 9/1966 | Pomerantz | 317/235 X |
| 3,440,114 | 4/1969 | Harper | 148/187 |
| 3,525,146 | 8/1970 | Hayashida et al. | 29/589 |

*Primary Examiner*—John W. Huckert
*Assistant Examiner*—William D. Larkins
*Attorney*—Spencer & Kaye

[57] ABSTRACT

A semiconductor device comprises a semiconductor body having two regions of different types of conductivity extending to one surface of the semiconductor body and to which contact is made by means of conducting paths extending over the surface and over the high resistance semiconductor areas provided on the surface. A method of making such a semiconductor device is also included.

8 Claims, 6 Drawing Figures

Patented April 25, 1972 3,659,156

Inventor:
Heinz Beneking
BY Spencer & Kaye
ATTORNEYS.

SEMICONDUCTOR DEVICE

BACKGROUND OF THE INVENTION

The invention relates to a semiconductor device.

In semiconductor components or integrated circuits produced by the planar technique, metallic conducting paths extend over an insulating layer which covers the semiconductor surface and which generally consists of silicon dioxide or silicon nitride. In silicon semiconductor bodies, the insulating layer is generally produced by thermal or anodic oxidation. These oxide layers can only be made a few $\mu$ m thick for technological reasons, so that the conducting paths with the semiconductor regions below the oxide layer often form undesirably high capacitances as a result of which the high-frequency characteristics of the semiconductor devices are impaired. In order to reduce these disturbing capacitances, it has already been proposed that a second insulating layer should be applied to the first insulating layer covering the surface of the semiconductor directly, the conducting paths and their ends constructed in the form of contact surfaces being taken over the second insulating layer. According to another proposal, etch pits, which are filled with insulating material deposited from the gaseous phase, are introduced into the semiconductor body from the surface common to the semiconductor regions. The conducting paths, which are electrically connected to the individual semiconductor regions, are then applied to this insulating material.

The last-mentioned method has the disadvantage that the insulating material cannot be made indefinitely thick in the etch pits. The production of landings of insulating material on the semiconductor surface render a change of method necessary, because the landings of the insulating material cannot be produced by thermal oxidation but have to be vapour-deposited, for example, on the first insulating layer which is formed by thermal means.

SUMMARY OF THE INVENTION

According to the invention there is provided a semiconductor device comprising a semiconductor body, at least two regions of different types of conductivity in said semiconductor body extending to one surface of said semiconductor body a plurality of high-resistance semiconductor areas on the surface of said semiconductor body, and conducting paths extending over said higher resistance semiconductor areas and over said semiconductor surface for making contact to said semiconductor regions.

BRIEF DESCRIPTION OF THE DRAWINGS

The invention will now be described in greater detail by way of example, with reference to the accompanying drawings in which.

DESCRIPTION OF THE PREFERRED EMBODIMENT

Figures 1, 2, 3, 4, 5, 6:
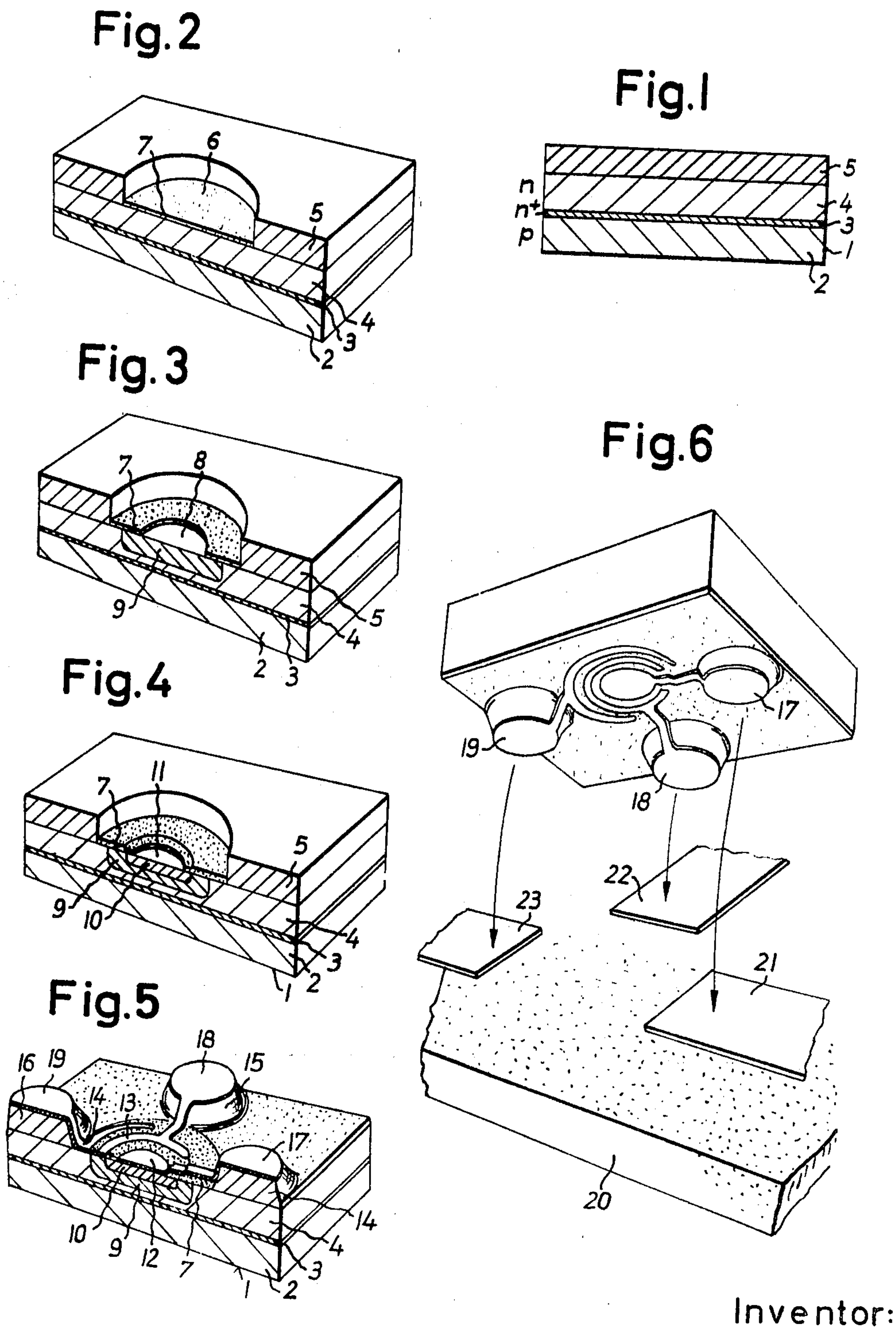
FIG. 1 is a sectional view of a semiconductor body having a multilayer construction and forms an initial stage of the formation of a semiconductor device in accordance with the invention.
FIG. 2 is a part perspective view of the semiconductor body of FIG. 1 in a second stage of the formation.
FIG. 3 is a part perspective view similar to FIG. 2 but showing a third stage.
FIG. 4 is a part perspective view similar to FIG. 2 but showing a further stage.
FIG. 5 is a part perspective view of the finished semiconductor body.
FIG. 6 is an exploded perspective view showing the attachment of the semiconductor body of FIG. 5 to a substrate.

Basically, the invention resides in the provision of high resistance semiconductor areas on the surface of a semiconductor body having at least two regions of different types of conductivity, over which areas conducting paths for contacting the regions pass.

The semiconductor device according to the invention can be produced very easily and has only a minimum of interfering capacitances which permit operation of the semiconductor device in the radio-frequency range. Furthermore, they can be used advantageously for the construction of circuits by the semiconductor device being placed with its conducting paths extending over the high-resistance semiconductor areas over associated conducting-path areas on a substrate and being connected to these conducting paths associated with a circuit, without wiring.

In the production of semiconductor devices, there is an ever increasing tendency to introduce the regions forming the semiconductor components into an epitaxial layer which is formed on a semiconductor foundation. It is therefore possible to produce the high-resistance semiconductor areas likewise epitaxially without a change of method, in which case the production of the high-resistance epitaxial layer preferably follows directly on the deposition of the epitaxial layer provided to receive the semiconductor regions.

The high-resistance epitaxial layer is perferably divided so that each conducting path is taken over a high-resistance semiconductor areas, all the high-resistance semiconductor areas, which are constructed in mesa form for example, being separated from one another. The high- resistance semiconductor areas preferably consist of the same monocrystalline semiconductor material of the semiconductor foundation. The epitaxial layer formed to produce the high resistance semiconductor areas may be substantially of any thickness. Layer thickness from 0.1 to 0.2 mm have proved particularly satisfactory.

Referring now to FIG. 1, there is shown a multilayer semiconductor body. Attention may here be drawn to the fact that the geometrical dimensions selected in the Figures do not necessarily correspond to the factual proportions but are selected for reasons of clarity. The semiconductor body 1 may consist, for example, of gallium arsenide and comprise a substrate 2 of P-type conductivity for example. On the substrate there is a highly doped, thin layer 3 of $N^+$-type of conductivity which serves, in transistors, as a so-called "buried layer" to reduce the collector path resistance. This layer may be produced epitaxially or by diffusion.

On the low-resistance layer 3, there is an epitaxial layer 4 with N-type doping, which is provided to receive the regions forming one or more semiconductor components. The epitaxial layer 4 is covered by a further high-resistance epitaxial layer 5 which is 0.1 to 0.2 mm thick for example and, if a gallium arsenide semiconductor substrate is used, consists of semi-insulating gallium arsenide which can be produced epitaxially. The last epitaxial layer 5 produced serves as a carrier for the conducting paths making contact to the semiconductor regions.

According to FIG. 2, an aperture 6 extending as far as the first epitaxial layer 4 is introduced into the extremely high-resistance epitaxial layer 5. Through this aperture, the regions forming the semiconductor components are then introduced into the epitaxial layer 4. For this purpose, the first epitaxial layer in the aperture 6 is covered with an insulating layer 7 which consists of silicon dioxide or silicon nitride for example. If the semiconductor material consists of silicon, the $SiO_2$ layer may be produced by thermal or anodic oxidation. With other semiconductor materials, the insulating layer of $SiO_2$ or silicon nitride is deposited on the semiconductor surface from the gaseous phase.

In order to produce a transistor in which the epitaxial layer 4 serves as a collector region, an aperture 8 is first introduced into the oxide layer 7 and through this aperture, as illustrated in FIG. 3, doping materials which form impurities are diffused into the layer 4, as a result of which some of the layer 4 has its doping reversed to from the base region 9 of a transistor. During the manufacture of the insulating layer 7, this will generally also form on the surface of the epitaxial layer 5. It may remain there or be removed again. It is of no importance if, in the latter case, impurities are formed at the surface of the epitaxial layer during the necessary diffusion processes because the depth of penetration of these impurities to a few μm is unimportant in comparison with the relatively great thickness of the epitaxial layer 5. Any desired number of apertures may be introduced into the insulating layer 7 in order to produce a plurality of regions of the same type of conductivity during the manufacture of other components.

During the production of a transistor, after the indiffusion of the base region 9 has been effected, the insulating layer on the semiconductor surface is completed again and provided with a further aperture 11 as shown in FIG. 4, which is smaller than the first aperture 8, and is situated inside this aperture 8 which has been closed again in the meantime. Impurity atoms are then diffused into the base region through the diffusion window 11 and reverse the doping of some of the base region 9 to form the emitter region 10. In order to produce a diode, only the semiconductor regions 4 and 9 illustrated in FIG. 4 are needed so that in this case the aperture 11 serves as a contact making window and an ohmic metal contact is applied to the diode region 9.

In general, in order to produce any semiconductor components or integrated circuits, the insulating layer 7 is completed and structured in the required manner for the indiffusion of regions or for making contact to semiconductor regions which have already been produced, repeatedly until all the semiconductor regions have been produced and provided with contacts. The photolacquer-masking, etching and diffusion technique, known from the planar technique, may advantageously be used during these processes.

The contacts at the individual semiconductor regions are preferably produced by vapour-deposition of one or more metal layers on the semiconductor surface, and the metal layer which at first covers the whole surface is likewise structured by means of the known photolacquer technique so that only the portions illustrated in FIG. 5 remain behind. Before the metal contacts are produced, the surface of epitaxial layer 5 may be cleaned, for example by etching if it has not been covered by an oxide layer during the diffusion processes.

As shown in FIG. 5, the emitter region is provided with a metal contact 12 which is connected, through a conducting path extending over the oxide layer 7, to a broad-area contact 17 on the epitaxial layer 5. There is a base contact 13 present in the same manner which is connected to the contact 18 on the epitaxial layer 5 through a metallic conducting path, while the collector contact 14 is connected to the contact 19 on the epitaxial layer 5. The broad-area contacts 17, 18 and 19 may serve as etching masks during a subsequent etching process during which all parts of the epitaxial layer 5 which are uncovered by the contact areas 17 and 19 may be removed apart from the surface of the epitaxial layer 4. In this manner, high-resistance semiconductor islands 15, 16 and 24 are formed, which are of mesa-like construction and project beyond the plane of the surface of the semiconductor body common to the semiconductor regions 4, 9 and 10, and which serve as supports for the conducting paths leading into contact areas 17, 18, and 19. The exposed portions of the surface of the epitaxial layer 4 are preferably covered with a passivating insulating layer, for example of silicon dioxide.

The conducting paths and metal contacts may consist, for example, of tantalum-gold or gold-germanium with gallium arsenide semiconductor bodies. Since the metal conducting paths have to be taken upwards at the relatively steep edges of the epitaxial layer 5, it is advisable to reinforce a thin metal layer, vapour-deposited originally, by currentless or electrodeposition subsequently.

As is particularly clear from FIGS. 5 and 6 after the conclusion of all the manufacturing processes, a semiconductor device is obtained wherein the high-resistance semiconductor areas 15, 16 and 24 are grouped round the regions forming a semiconductor component on the surface of the semiconductor body.

Such semiconductor devices are particularly suitable, as illustrated in FIG. 6, for the connection of individual circuit elements, without wires, to form a multi-chip semiconductor circuit which may be combined with thin-film or thick-film components. For this purpose, an insulating supporting substrate 20 is used for example, over which there extend conducting paths interconnecting individual components or integrated circuits. Only three end points 21, 22 and 23 of such conducting paths are allustrated in FIG. 6 and are provided for the connection of a transistor component as shown in FIG. 5. This transistor component is placed on the substrate 20 with its contact surfaces 17, 18 and 19 on the associated ends of the conducting paths 21, 22 and 23. The contact surfaces of the transistor are connected to the conducting paths on the substrate in a mechanically firm manner with satisfactory electrical conduction, by soldering or ultrasonic welding.

The semiconductor device according to the invention is naturally not restricted to specific semiconductor materials, types of component or doping relationships between individual semiconductor regions but can always be adapted to the most varied requirements. What is important is that the semiconductor layer carrying the conducting paths or contact surfaces should be made with as high a resistance and as thick as possible so that, if possible, no more disturbing capacitances occur between the individual connecting electrodes of the finished semiconductor component or components. The specific resistance of the high-resistance semiconductor layer is greater than $10^3$ Ohmcm for example.

It will be understood that the above description of the present invention is susceptible to various modifications, changes and adaptations.

What is claimed is:

1. A semiconductor device comprising a semiconductor body of monocrystalline material, at least two regions of different types of conductivity in said semiconductor body extending to one surface of said semiconductor body, a plurality of high-resistance monocrystalline semiconductor areas grown directly on said surface of said semiconductor body, an insulating layer covering the areas of said surface of said semiconductor body which remain uncovered by said high-resistance semiconductor areas, and a plurality of conducting paths extending over and in contact with said higher-resistance semiconductor areas and over said insulating layer overlying the semiconductor surface for making contact to said semiconductor regions via openings in said insulating layer.

2. A semiconductor device as defined in claim 1, wherein said high-resistance semiconductor regions comprise epitaxially deposited semiconductor material.

3. A semiconductor device as defined in claim 1, wherein each said conducting path passes over one of said high-resistance semiconductor areas, each of said high-resistance semiconductor areas being separated from the other said high-resistance semiconductor areas.

4. A semiconductor device as defined in claim 3, wherein said high-resistance semiconductor areas are mesa-like.

5. A semiconductor device as defined in claim 1, wherein said semiconductor body comprises gallium arsenide and said high-resistance semiconductor areas comprise semi-insulating, epitaxially deposited gallium arsenide.

6. A semiconductor device as defined in claim 1, further comprising a substrate, and conductive path areas on said substrate, over which substrate said semiconductor body is placed with its conducting paths extending over said high-resistance semiconductor areas positioned on and connected to said conductive path areas.

7. A semiconductor device as defined in claim 1, wherein said high-resistance semiconductor areas have a thickness of from about 0.1 to 0.2 mm.

8. A semiconductor device as defined in claim 1, wherein said high-resistance semiconductor areas are grouped around said regions.

* * * * *